United States Patent [19]

Nagashima et al.

[11] 4,328,531
[45] May 4, 1982

[54] THICK FILM MULTILAYER SUBSTRATE

[75] Inventors: Toshio Nagashima; Takeshi Saitoh, both of Yokohama; Hiroshi Hatashita, Tokyo; Mitsuhisa Shinagawa, Fujisawa, all of Japan

[73] Assignee: Hitachi, Ltd., Tokyo, Japan

[21] Appl. No.: 134,623

[22] Filed: Mar. 27, 1980

[30] Foreign Application Priority Data

Mar. 30, 1979 [JP] Japan .................. 54-36893

[51] Int. Cl.³ .............................................. H05K 1/16
[52] U.S. Cl. .................. 361/401; 174/68.5; 361/407; 361/410; 361/414
[58] Field of Search ................. 174/68.5, 36; 361/414, 361/401, 407, 410

[56] References Cited

U.S. PATENT DOCUMENTS

| 3,561,110 | 2/1971 | Feulner | 361/414 X |
|---|---|---|---|
| 3,680,005 | 7/1972 | Jorgeson | 361/414 X |
| 3,726,002 | 4/1973 | Greenstein | 174/68.5 X |
| 3,838,204 | 9/1974 | Ahn | 361/414 X |
| 3,875,479 | 4/1975 | Jaggar | 361/414 |
| 3,895,435 | 7/1975 | Turner | 174/117 PC X |
| 3,916,514 | 11/1975 | Salminen | 361/414 X |
| 4,030,190 | 6/1977 | Varker | 174/68.5 X |
| 4,202,007 | 5/1980 | Dougherty | 174/68.5 X |
| 4,237,606 | 12/1980 | Niwa | 174/68.5 X |

Primary Examiner—Richard R. Kucia
Attorney, Agent, or Firm—Craig and Antonelli

[57] ABSTRACT

A thick film multilayer substrate using a green ceramic sheet is constructed such that at least three conductor layers and at least two dielectric layers are alternately arranged in turn on the green ceramic sheet substrate, a power supply line being formed in the second conductor layer and thus interposed between the first and third conductor layers in which grounded conductors are formed.

1 Claim, 8 Drawing Figures

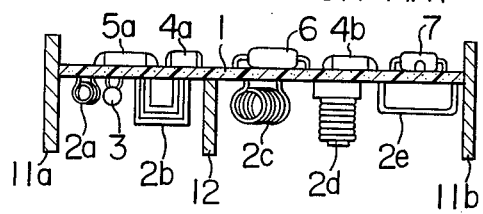
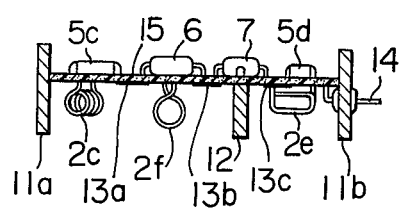
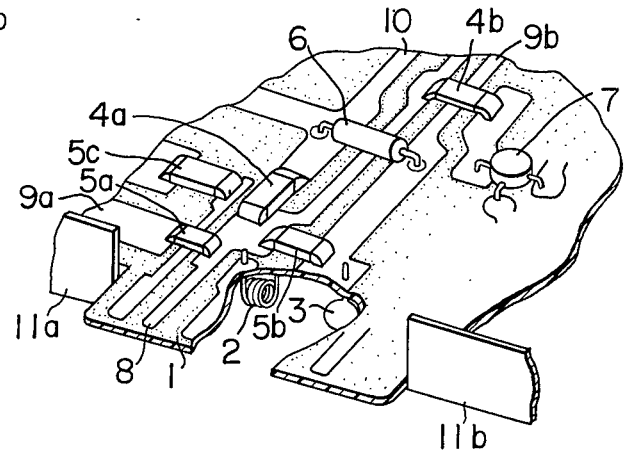
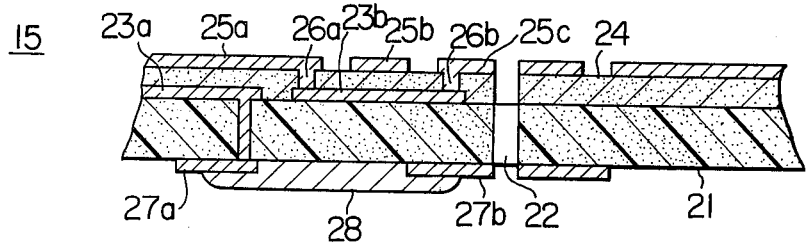
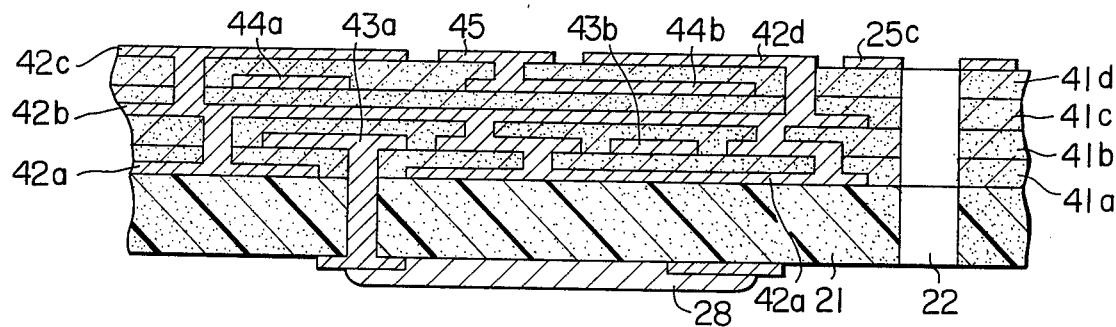

THICK FILM MULTILAYER SUBSTRATE

FIELD OF THE INVENTION

The present invention relates to circuit boards for electronic circuits, and particularly to a thick film multilayer substrate used for a hybrid integrated circuit of a tuner in television receivers.

BRIEF DESCRIPTION OF THE DRAWINGS

FIG. 1 is a cross-sectional view of a conventional tuner which has been used in television receivers.

FIG. 2 is a perspective view of a main part thereof.

FIG. 3 is a cross-sectional view of a tuner utilizing a hybrid integrated circuit according to the invention.

FIG. 4 is a cross-sectional view of a thick film multilayer substrate according to the invention.

FIG. 5b is a cross-sectional view thereof taken along line Vb—Vb in FIG. 5a.

FIG. 6 is a cross-sectional view of a second embodiment of the improved thick film multilayer substrate according to the invention.

DESCRIPTION OF THE PRIOR ART

Figure 5A:
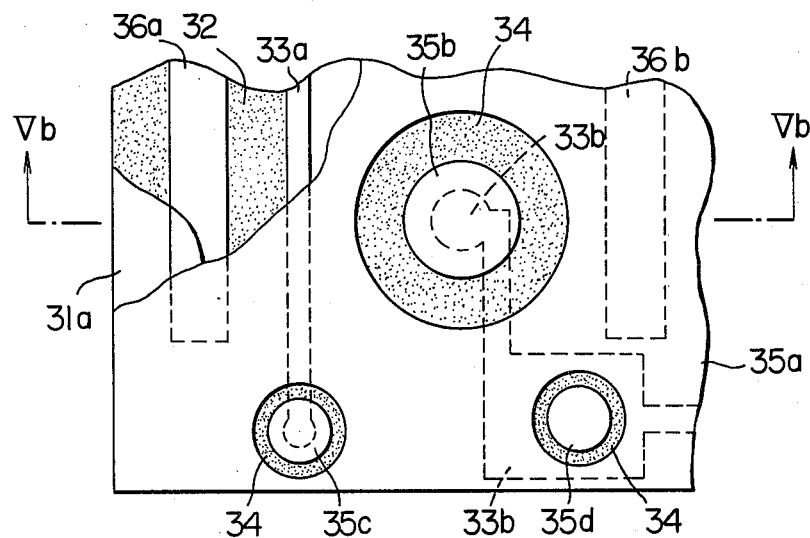
FIG. 5a is a plan view of an improved thick film multilayer substrate according to the invention.

A conventional tuner, as illustrated in FIGS. 1 and 2, is composed of a printed wiring board 1 having arranged on one surface coils 2a to 2e, a capacitor 3 and a shielding plate 12 and on the other surface resistors 4a and 4b, capacitors 5a to 5c, a diode 6 and a transistor 7, these components being interconnected by copper foil conductors 8, 9a, 9b and 10. The conductor 8 is used for leading the power supply voltage to the circuits, the conductors 9a and 9b for grounding and the conductor 10 for transmission of signals. The printed wiring board 1 is supported by metal casings 11a and 11b. In such conventional tuner, the printed wiring board 1 has thickness of 1 to 6 mm, and specific dielectric constant of 2 to 4, and the copper foil conductors 8, 9a, 9b and 10 are about 0.5 to 1.0 mm thick, so that the characteristic impedances of the conductor lines range from 100 to 200 ohms. In addition, since the copper conductor patterns 8, 9a, 9b and 10 are formed in parallel on the printed circuit board 1, the same become long in length and leakage of signals occurs as will be described below. An image frequency signal which is received by, for example, an antenna of a television receiver and flowed through the signal line 10, and an intermediate frequency signal are leaked to the power supply conductor 8. A local oscillation signal generated from a local oscillation circuit of the tuner is also easily leaked to the power supply conductor 8. When leaking to the power supply conductor 8, the image frequency signal and the intermediate frequency signal readily arrive at the output of the tuner, to be superimposed upon the output signal from the tuner. This degrades the undesired-wave removing characteristic such as the image frequency interference removing characteristic and intermediate frequency signal interference removing characteristic. Moreover, if a local oscillation signal leaks to the power supply conductor 8, the same is further escaped to the external out of the tuner through the conductor 8. This also deteriorates the local oscillation signal leakage protection characteristic. In order to avoid this, a number of bypass capacitors 5a, 5b and so on are connected between the power supply conductor 8 and the grounding conductors 9a and 9b thereby to decrease the impedance of the conductor 8, or a high-frequency signal blocking choke coil 2a is connected in series with the conductor 8 thereby to jblock the local oscillation signal and intermediate frequency signal not to be transmitted to the power supply conductor 8.

SUMMARY OF THE INVENTION

It is an object of the invention to provide a circuit board, or circuit substrate having thereon a power supply conductor the characteristic impedance of which is low enough to attenuate the local oscillation signal, image frequency signal and intermediate frequency signal when they leak to the power supply conductor, and which circuit substrate is constructed so that the local oscillation signal and so on are difficult to leak to the power supply conductor.

To achieve this object, the circuit substrate of the invention is formed by a thick film multilayer substrate using a green ceramic sheet. In this thick film multilayer substrate, three conductor layers are separately formed through dielectric layers on the green ceramic sheet and a power supply conductor is formed in the second conductor layer thereof which lies between the first and third conductor layers thereof as grounding patterns.

DESCRIPTION OF THE PREFERRED EMBODIMENTS

The hybrid integrated circuit substrate according to the invention will be described with reference to the drawings. FIG. 3 is a cross-sectional view of a tuner using a hybrid integrated circuit substrate according to the invention. A substrate 15 supported by the metal casings 11a and 11b is a thick film multi-layer ceramic substrate having thereon a plurality of conducting layers and a plurality of dielectric layers interposed between the conducting layers as will be described in detail later. The diode 6, transistor 7, coupling capacitors 5c and 5d, coils 2c, and 2e and 2f, resistors 13a, 13b and 13c and a terminal 14 are electrically interconnected to each other through the multilayer conductors. The resistors 13a, 13b and 13c are printed in a film form on one surface of the ceramic substrate and then fired to be formed as thick film resistors.

The multilayer thick film substrate will be described which is formed of a ceramic substrate, electrodes, dielectrics, and resistors and used for a hybrid integrated circuit substrate. FIG. 4 is a cross-sectional view of a thick film multilayer substrate which is fabricated as described below. A ceramic substrate 21 is first prepared which is separated to have a definite size from an unfired ceramic sheet (green sheet) plate by cutting and has bored therein an aperture 22. On one surface of this ceramic substrate 21 are printed first conductor layers 23a and 23b which are a mixture of tungsten (W) as a main component, molybdenum (Mo), tantalum (Ta) and others. Then, a dielectric 24 of 90 to 94% alumina is printed or attached to the entire surface thereof, and on the dielectric 24 are printed second conductor layer 25a, 25b and 25c in the same way as in the first conductor layers 23a and 23b. Subsequently, third conductor layers 27a and 27b are printed on the other surface of the ceramic substrate 21. The ceramic substrate 21 is about 1 mm thick, the conductor layers 23a, 23b, 25a, 25b, 25c, 27a and 27b are about 8 to 12 μm thick and the dielectric 24 is about 30 to 40 μm thick. The conductors 25a and 25c are interconnected to each other by conductors 26a and 26b which are passed through holes and the conductor 23b. Then, the substrate with the printed layers is fired at about 1500° C. for 10 to 20 hours, and subsequently plated on the conductor layers 27a and 27b with nickel (Ni) and gold (Au) of thickness ranging from 3 to 5 μm. Thereafter, on the ceramic between the conductors 27a and 27b there is printed a cermet (ceramic-metal) resistor or carbon-resin resistor material to form a resistor 28. If the cermet resistor material is printed for the resistor 28, the conductors or electrodes 27a and 27b are formed by a paste containing silver (Ag) and palladium (Pa). If a carbon resin resistor material is printed for the resistor 28, the printed resistor 28 is then cured at 150° C. to 200° C. for 2 to 4 hours. While, when the cermet resistor material is used, the printed cermet resistor 28 is fired at 500° C. to 600° C. The conductors 23a and 25a are opposed to each other to form a capacitor. The conductor 25b serves as a power supply line, and the capacitors 5c and 5d, diode 6, and transistor 7 are connected to the conductor layers 25a, 25b and 25c. The coils 2c, 2e and 2f are connected to the conductor layers 25c and 27b by passing their ends through the aperture 22.

On one surface of the thick film multilayer substrate arranged are the resistors 13a, 13b and 13c, and coils 2c, 2e and 2f, while on the other surface thereof there are disposed the capacitors 5c and 5d, diode 6 and transistor 7. The multilayer construction enables the running conductors to be shortened and the specific dielectric constant of the alumina dielectric is around 10 which is larger than that of the conventional printed wiring board, thus reducing the characteristic impedance. This results in the fact that the local oscillation signal, and intermediate frequency signal are difficult to leak into the conductor 25b and so on. However, in this thick film multilayer substrate, the local oscillation signal and so on flowing through the conductors 25a, 23b and 23c may still leak into the conductor 25b via, for example, the stray capacitance between the conductor 25b and conductors 25a, 23b and 25c. Therefore, this thick film multilayer substrate is unable to provide satisfactory intermediate-frequency and image-frequency signal interference removing characteristics.

Figure 5B:
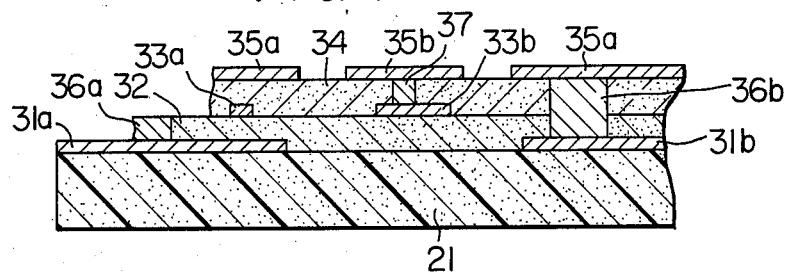

An improved thick film multilayer substrate with the drawbacks of the above-mentioned substrate obviated will next be described. FIG. 5a is a partial plan view of the improved thick film multilayer substrate, and FIG. 5b is a cross-sectional view taken along a line Vb—Vb in FIG. 5a. As illustrated in FIGS. 5a and 5b, on the ceramic substrate 21 there are printed first conductor layers 31a and 31b, over which a first dielectric layer 32 is then printed or attached. Second conductor layers 33a and 33b are formed on the first dielectric layer 32. Then, on the second conductor layers 33a and 33b is formed a second dielectric layer 34, on which third conductor layers 35a and 35b are formed. The first conductor layers 31a and 31b are connected to the third conductor layer 35a by connection conductors 36a and 36b. In FIGS. 5a and 5b there are not shown apertures through which are passed the ends of the resistors and coils disposed on the rear side of the ceramic substrate 21.

In this improved printed multilayer substrate, the conductors 35b, 35c and 35d serve as connection electrodes for connecting the transistors and diodes, and the conductor 33b is also a connection conductor for connecting the conductors 35b and 35d. The conductor 33a serves as a power supply line, and the conductors 31a, 31b and 35a as grounded conductors. It will be seen from FIG. 5b that in this improved substrate, the power supply line 33a is disposed between the grounded conductors 31a and 35a. This construction is the feature of the invention. The disposition of the power supply line 33a between the conductors 31a and 35a enables the power supply line 33a to be shielded by the grounded conductors 31a and 35a. Thus, the local oscillation signal and intermediate frequency signal are difficult to leak into the power supply line 33a. In addition, capacitors are formed between the power supply lines 33a and the conductors 31a and 35a, thereby reducing the characteristic impedance. If, for example, the power supply line 33a is selected 0.5 mm wide and 15 μm thick, and the dielectrics 32 and 34 are chosen 30 to 40 μm thick and a dielectric constant of 9 to 10, the characteristic impedance becomes 3 to 4 ohms which is 1/30 to 1/50 of that of the conventional printed wiring board. Even though the local oscillation signal leaks into the power supply line 33a, the leaked signal is rapidly attenuated due to the low characteristic impedance. Therefore, this improved substrate provides a feature of an undesired wave removing characteristic and an excellent local oscillation signal leak prevention characteristic.

A second embodiment of the improved thick film multilayer substrate will be described with reference to FIG. 6. In this second embodiment, five layers of conductors are formed between which four dielectric layers 41a and 41d are respectively interposed. The first conductor layer 42a, third conductor layer 42b and fifth conductors 42c and 42d are interconnected to each other and serve as grounded conductors. The second conductors 43a and 43b serve as power supply lines, and the conductor 43a is connected to the resistor 28 through a conductor path in the alumina substrate 21. The fourth conductor layer 44a is also a power supply line. The fourth conductor layer 44b forms capacitors together with the conductors 42b and 42d. The fifth conductor layer 45 is a connection electrode to which diodes and transistors are connected. The aperture 22 is provided through which the end of a coil is inserted similarly as in FIG. 4. The connection conductor 25c is connected with the coil. Also in this embodiment, on both sides of the power supply lines 43a and 43b are arranged the grounded conductors 42a and 42b and on both sides of the power supply line 44a are disposed the grounded conductors 42b and 42c. Therefore, the characteristic impedances of the power supply lines 43a, 43b and 44a are low and these lines are never coupled to the other signal lines.

Figure 7:
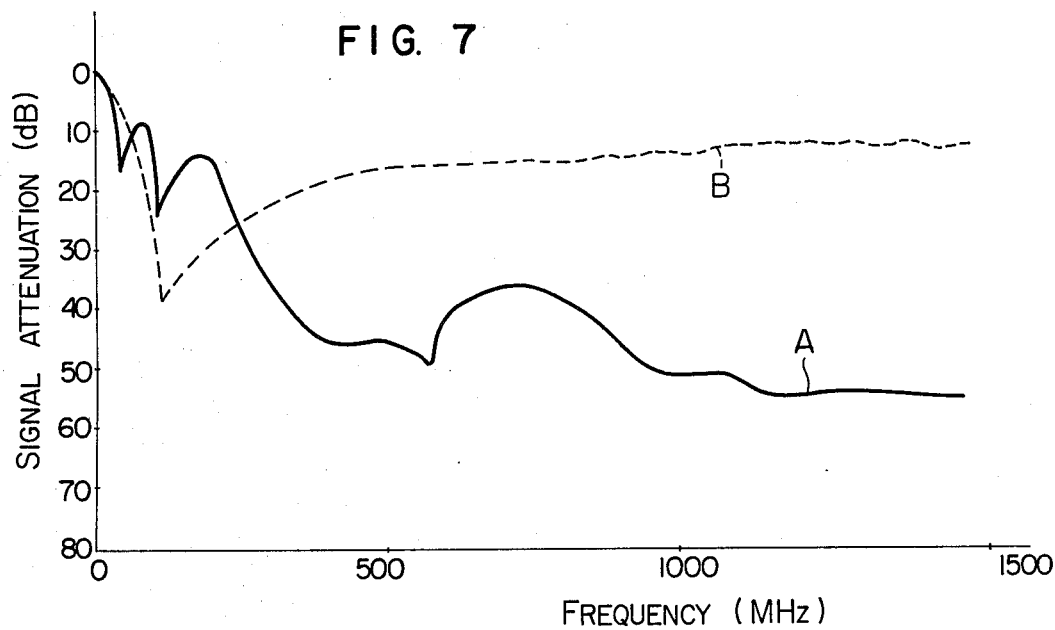
FIG. 7 is a graph of signal attenuation in the power supply conductor pattern of the improved thick film multilayer substrate according to the invention.

FIG. 7 are attenuation characteristic curves of local oscillation signal in the power supply lines of the tuner, in which the ordinate shows the signal attenuation and the abscissa the frequency. A solid curve A indicates the characteristic of the improved thick film multilayer of the invention and a broken curve B shows the characteristic of the case where a 2200 pF chip capacitor is used. The power supply lines on the improved substrate of the invention are about 3 cm long and about 3 mm wide and capacitance values range from 300 to 500 pF. It will be understood from FIG. 7 the attenuation characteristic of the improved thick film multilayer substrate is not always satisfactory at VHF band but is more excellent than in the case using the chip capacitor at the frequencies higher than about 300 MHz, thus decrease of the number of bypass capacitors being possible.

While three or five conductor layers are formed in the embodiment of the invention as shown in FIGS. 5 and 6, seven conductor layers may be formed with similar effect. Moreover, in the embodiments of FIGS. 5 and 6, it is possible to coat the conductors 35a, and the conductors 42c and 42d by a dielectric for insulation.

In accordance with the present invention as described above, use is made of a thick film multilayer substrate which is a green ceramic sheet having a plurality of conductor layers and dielectric layers alternately formed thereon, and in this thick film multilayer substrate the power supply line is interposed between two grounded conductors, so that the characteristic impedance of the power supply line becomes low and high-frequency AC signals are prevented from being transmitted to the power supply line because the power supply line is shielded by the grounded conductors. In addition, if high frequency AC current flows into the power supply line, the same is rapidly attenuated.

Accordingly, use of the thick film multilayer substrate of the invention in the tuner of a television receiver or the like will be effective to remarkably improve the undesired wave remove characteristic and local oscillation signal leak prevention characteristic of the tuner. Thus, the tuner using such thick film multilayer substrate of the invention does not almost require bypass capacitors and choke coils.

We claim:

1. In a thick film multilayer wiring substrate comprising:
   (1) a ceramic substrate having first and second surfaces opposite to one another;
   (2) at least first and second layers of dielectrics formed on the first surface of said ceramic substrate, with said first layer being stacked on said substrate and said second layer being stacked on said first layer;
   (3) a first conductor layer including at least a power supply line pattern, formed between the first and second layers of dielectrics;
   (4) second and third conductor layers each including at least a grounded conductor pattern, said second conductor layer being formed on a surface adjacent to said ceramic substrate of the first dielectric layer and said third conductor layer being formed on a surface farthest from said ceramic substrate of the second dielectric layer; and
   (5) a grounded conductor connection path formed to pass though the first and second layers of dielectrics to connect the grounded conductor patterns of said second and third conductor layers to each other,
   wherein the improvements comprise:
   the grounded conductor patterns of said second and third conductor layers being formed to extend to oppose each other via the two layers of dielectrics so that said power supply line pattern is located between the two layers of dielectrics where the grounded conductor patterns extend, whereby capacitance is established between the power supply line pattern and the grounded conductor patterns to reduce a characteristic impedance of the power supply line pattern, and
   said thick film multilayer wiring substrate further comprising a fourth conductor layer including a plurality of connection wiring patterns, formed on the second surface of said ceramic substrate; at least one resistor layer being formed between said plurality of connection wiring patterns; and at least one conductor connection path passing through said ceramic substrate to connect said plurality of connection wiring patterns to at least one of said first, second and third conductor layers.

* * * * *